United States Patent
Buchanan (10) Patent No.: US 9,490,010 B2
(45) Date of Patent: Nov. 8, 2016

(54) NON-VOLATILE MEMORY BASED SYNCHRONOUS LOGIC

(71) Applicant: Hewlett-Packard Development Company, L.P., Houston, TX (US)

(72) Inventor: Brent Edgar Buchanan, Fort Collins, CO (US)

(73) Assignee: Hewlett Packard Enterprise Development LP, Houston, TX (US)

(*) Notice: Subject to any disclaimer, the term of this patent is extended or adjusted under 35 U.S.C. 154(b) by 0 days.

(21) Appl. No.: 14/780,381

(22) PCT Filed: Mar. 27, 2013

(86) PCT No.: PCT/US2013/034095
§ 371 (c)(1),
(2) Date: Sep. 25, 2015

(87) PCT Pub. No.: WO2014/158149
PCT Pub. Date: Oct. 2, 2014

(65) Prior Publication Data
US 2016/0055907 A1 Feb. 25, 2016

(51) Int. Cl.
| G06F 7/38 | (2006.01) |
| H03K 19/173 | (2006.01) |
| G11C 13/00 | (2006.01) |
| G11C 16/06 | (2006.01) |
| G11C 16/30 | (2006.01) |

(52) U.S. Cl.
CPC ....... *G11C 13/0069* (2013.01); *G11C 13/0007* (2013.01); *G11C 16/06* (2013.01); *G11C 16/30* (2013.01); *H03K 19/1733* (2013.01); *G11C 2013/0073* (2013.01)

(58) Field of Classification Search
None
See application file for complete search history.

(56) References Cited

U.S. PATENT DOCUMENTS

| 7,471,554 B2 | 12/2008 | Spall et al. | |
| 8,103,841 B2 | 1/2012 | Sinclair et al. | |
| 8,456,892 B2* | 6/2013 | Yasuda | G11C 13/0004 365/148 |
| 2004/0125643 A1 | 7/2004 | Kang et al. | |
| 2006/0028247 A1* | 2/2006 | Hara | G11C 11/22 326/104 |
| 2006/0067098 A1 | 3/2006 | Ferrant | |
| 2006/0181916 A1 | 8/2006 | Roehr | |
| 2009/0225591 A1 | 9/2009 | Liu et al. | |
| 2010/0091549 A1* | 4/2010 | Lee | G11C 11/16 365/148 |
| 2012/0014169 A1 | 1/2012 | Snider | |
| 2013/0027081 A1* | 1/2013 | Nazarian | H03K 19/1776 326/44 |

OTHER PUBLICATIONS

Kaehr, R., "Diamondization of HP's Memristive Flip-flop Circuit," (Web Page), 15 pages.
Memristor, "Memristor-based Nonvolatile Synchronous Flip-flop Latch Circuits," (Journal of Nanotechnology), (Web Page), accessed Dec. 8, 2015 at http://www.memristor.org/electronics/424/memristor-based-nonvolatile-synchronous-flip-flop-latch-circuits, 2 pages.
PCT; "Notification of Transmittal of the International Search Report and the Written Opinion of the International Searching Authority, or the Declaration"; cited in PCT/US2013/034095; mailed Dec. 26, 2013; 11 pages.

* cited by examiner

*Primary Examiner* — Anh Tran
(74) *Attorney, Agent, or Firm* — International IP Law Group, LLC (57) ABSTRACT

A method for setting resistance states of a first and a second resistive memory element (RME) is disclosed. The method may include coupling, via a common node, a first RME to a second RME. The method may include setting the first RME to either a high voltage resistance state or a low voltage resistance state. The method may include setting the second RME to a different state relative to the state of the first RME, wherein setting the second RME is substantially simultaneous with setting the first RME.

19 Claims, 8 Drawing Sheets

NON-VOLATILE MEMORY BASED SYNCHRONOUS LOGIC

CROSS-REFERENCE TO RELATED APPLICATION

This application is a United States National Stage Application of International Patent Application No. PCT/US2013/034095, filed on Mar. 27, 2013, the contents of which are incorporated by reference as if set forth in their entirety herein.

BACKGROUND

Computing devices generally include a wide variety of different electronic logic circuits with clocked storage cells throughout the logic circuit. Very-large-scale-integration clocked storage cells include flip-flops and latches. A flip-flop is a circuit that is programmable to one of two states and is used to store state information of the logic circuit. A flip-flop is configured to store a state associated with upstream logic. The flip-flop receives an input from upstream logic and provides the state to downstream logic. The output of the flip-flop is dependent on the input received from the upstream logic and the current state of the flip-flop. The flip-flop may also receive a clock signal that controls the timing of flip-flop state changes to provide synchronization with upstream and downstream logic devices. Many storage cells of logic circuits, including flip-flops and latches, lose their state when powered down resulting in an undetermined state when powered back on. Since logic paths may be many clock cycles deep, clearing out the random state, or configuring the circuit for a specific operational state, requires time, design complexity, and power.

BRIEF DESCRIPTION OF THE DRAWINGS

Certain examples are described in the following detailed description and in reference to the drawings, in which.

DETAILED DESCRIPTION OF SPECIFIC EMBODIMENTS

The present techniques relate to logic circuits including logic cells having non-volatile memory elements. More specifically, traditional clocked storage cells such as latches or flip-flops are replaced by the logic cells including the non-volatile memory elements. The logic cell receives input from upstream logic and receives a program pulse in place of a clock signal received by the traditional flip-flop. The non-volatile memory elements of the logic cell include resistive memory elements including a first resistive memory element and a second resistive memory element that are coupled to each other via a common node. The coupled resistive memory elements are configured to store the state of the non-volatile memory element in real time and create the non-volatile memory element's output. The non-volatile memory elements simultaneously update their state with each program pulse and maintain that state during any power interruptions.

Figure 1:
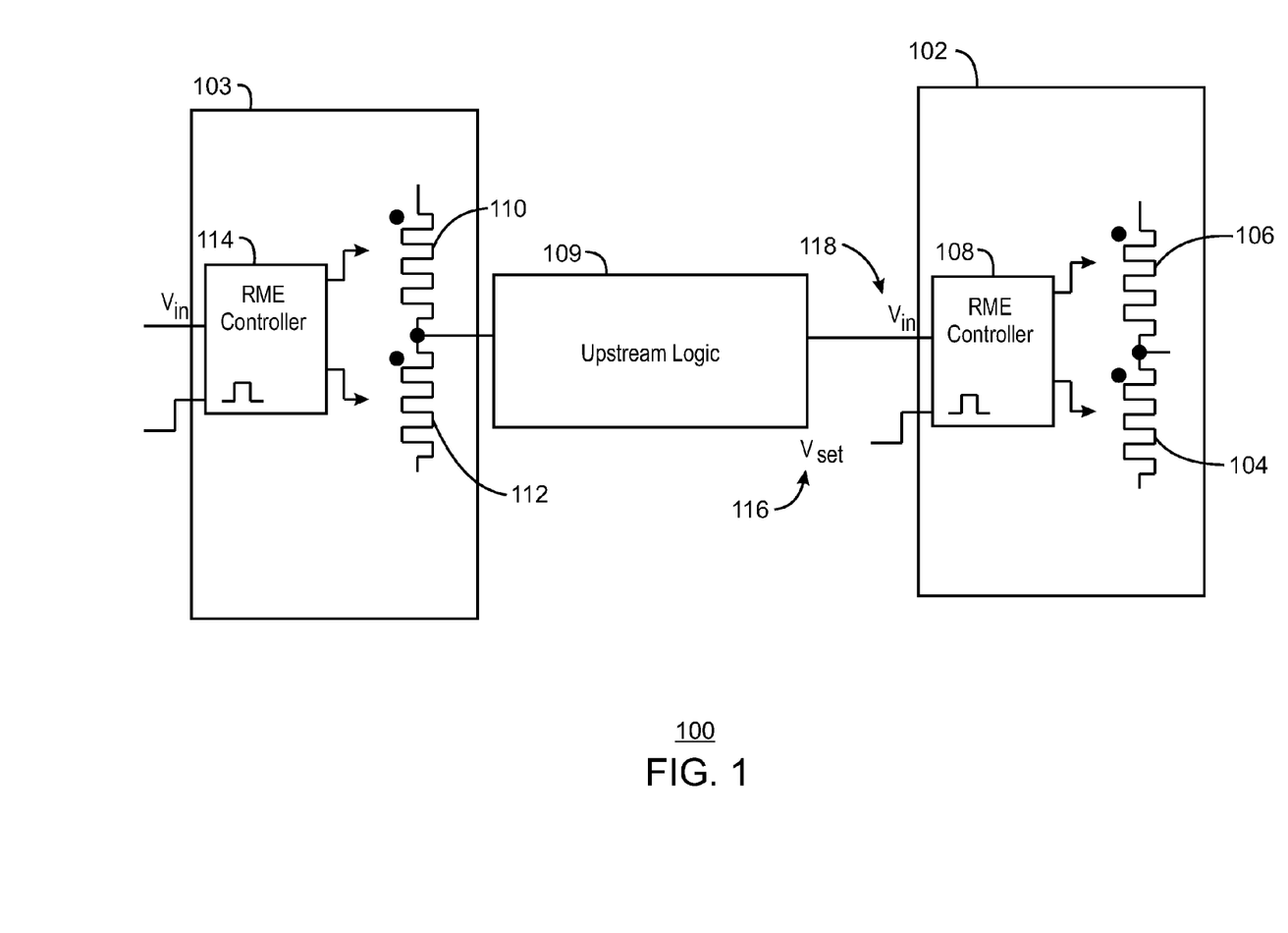
FIG. 1 is a diagram illustrating a logic circuit including a non-volatile memory element.

FIG. 1 is a diagram illustrating a logic circuit including a non-volatile memory element. The logic circuit 100 may include a number of logic cells 102, 103. Each logic cell 102, 103 can include a pair of Resistive Memory Elements (RMEs) 104, 106, 110, 112 and an RME controller 108, 114. As illustrated in FIG. 1, the RME controller 108 may be disposed to receive voltage associated with upstream logic 109.

The RME controller 108 includes logic configured to set the each of the RMEs 104, 106 to either a high resistance state or a low resistance state, respectively. The RME controller 108 receives a program pulse as indicated by $V_{set}$ at the arrow 116. The program pulse 116 replaces the clock signal associated with a traditional flip-flop. The program pulse 116 may be associated with a time element of the operations of the upstream logic 109. The RME controller 108 also receives a voltage input signal, as indicated by $V_{in}$ at the arrow 118. The voltage input signal 118 is the output of the upstream logic 109.

As discussed above, the program pulse 116 is associated with a time element of the system within which the first and second RMEs operate as memory elements. The program pulse 116 may be denoted by "$V_{set}$" in FIGS. 1 and 6. The voltage input signal 118 indicates the output of upstream logic 109. The voltage input signal 118 may be denoted by "$V_{in}$" in FIGS. 1-7. The system may include a supply voltage and a special supply voltage, as discussed further below in reference to FIGS. 3-5, and 7.

The RMEs 104, 106, are configured to change state (either a low resistance state or a high resistance state) based on the voltage input signal 118 received at the RME controller 108 from the upstream logic 109. The RMEs 104, 106, are configured to preserve their respective states even when a power source is removed from the logic circuit 100. In some embodiments, the RMEs 104, 106 are memristors composed of Transition Metal Oxide configured to transition from a normal state to a high resistance state or a low resistance state. In other embodiments, the RMEs 104, 106 may be a conductive bridge, a multi-valence oxide, or other material systems having thermal or ionic resistive switching effects.

As referred to herein, a "high resistance state" is a state of relatively high resistance exhibited by either of the RMEs 104, 106 after being configured by the RME controller 108. A high resistance state is relatively higher than a low resistance state. A low resistance state, as referred to herein, is a relatively lower resistance state when compared to the high resistance state. For example, the RME controller 108 can configure the RME 104 to a low resistance state of 1 kiloohm while the RME 106 may be configured to a high resistance state of 1 gigaohm.

The logic circuit 100 is configured to set, reset, and hold resistance states in the RMEs 104, 106, based the indication of the voltage input signal 118 provided by the upstream logic 109. The logic cell 102 may be set upon receiving the program signal 116, wherein the logic cell receives the output of the upstream logic 109.

Figure 2:
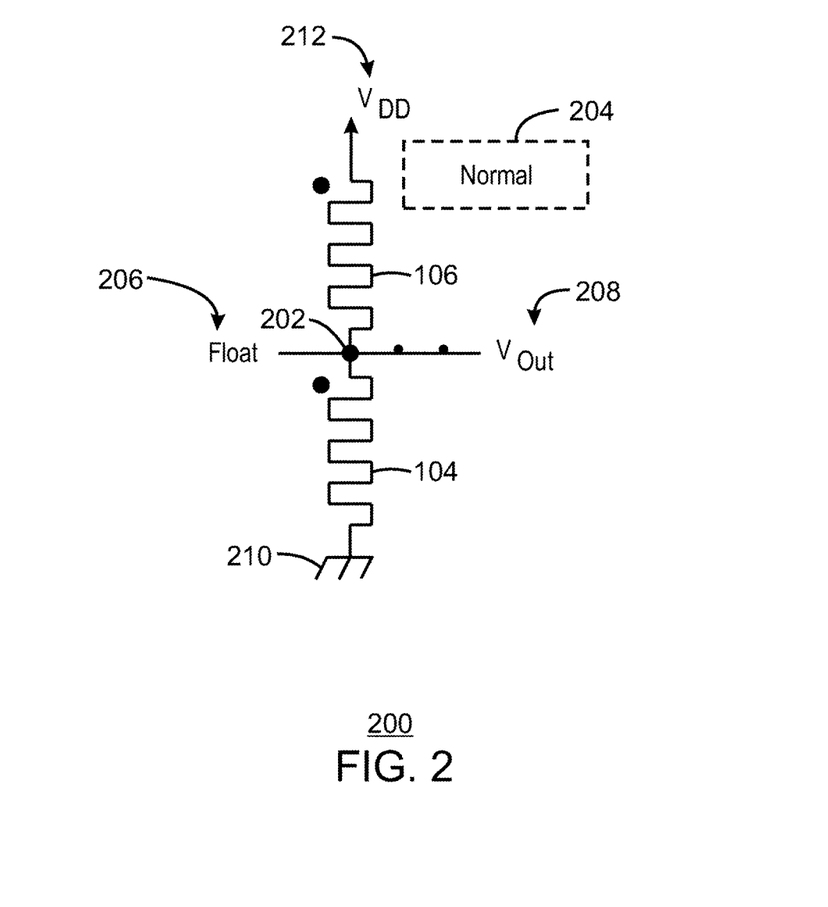
FIG. 2 is a diagram illustrating resistive memory elements (RMEs) coupled to one another.

FIG. 2 is a diagram illustrating RMEs 104, 106 coupled to one another at a common node 202. As indicated by the dashed lined box 204, the RMEs 104, 106 are set to a normal mode. In the normal mode 204, the common node 202 has a floating input as indicated by the arrow 206, and may generate a voltage output as indicated by the arrow 208. The voltage output may enable any further downstream logic (not shown) to read the state of the logic cell 102. The RME 104 may be referred to herein as a first RME, and the RME 106 may be referred to herein as a second RME. In the normal mode 204, the first RME 104 may be coupled to a ground signal as indicated by the arrow 210, and the second RME 106 may be coupled to a supply voltage as indicated by the arrow 212. The supply voltage 212 is a power supply that is distinct from the ground signal 210 and the program pulse 116 discussed above in reference to FIG. 1. The supply voltage 212 is also distinct from the special supply voltage discussed below in reference to FIGS. 3-5 and 7. The supply voltage 212 is denoted with "VDD" in FIGS. 2-7.

In the normal mode 204, the combined coupling of the RME's 104, 106 may be provided to any downstream logic. The voltage output 208 will provide a voltage level associated with a logic value of either 1 or 0. The VDD 212 may be associated with a logic 1, while the ground signal 210 may be associated with a logic 0. The voltage output 208 will depend on the combination of the resistance states that the RME's 104, 106 were set after receiving the program pulse 116 of FIG. 1. For example, if the first RME 104 is in a high resistance state and the second RME 106 is in a low resistance state, Vout 208 will be approximately equal to VDD 212. By contrast, if the first RME 104 is in a low resistance state and the second RME 106 is in a high resistance state, Vout 208 will be approximately equal to zero. The logic output when Vout 208 is approximately equal to VDD may be a logic 1. The logic output when Vout 208 is approximately equal to zero may be a logic output 0.

Figure 3A:
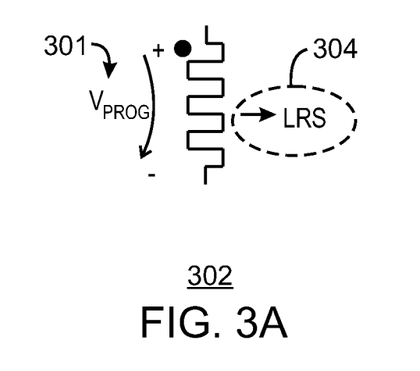
FIG. 3A is a diagram of a RME configured to a low resistance state.

FIG. 3A is a diagram of a RME configured to a low resistance state. The RME 302 may be the first RME 104 or the second RME 106 of FIG. 1. As the RME controller 108 receives the program pulse 116, a special supply voltage, $V_{prog}$, indicated by the arrow 301, may set or reset the RME's 104, 106. The special supply voltage 301 is a supply voltage that is continuous rather than intermittently supplied such as the program pulse 116 of FIG. 1. The special supply voltage 301 can applied to the RMEs simultaneously upon receiving the program pulse 116 by applying the special supply voltage 301 across RME 302. The resulting pulse of current alters the resistance state of the RME 302. The resulting current travels through the RMEs 302, 304 in one direction as illustrated in FIG. 3A, or in an opposite direction as discussed below in regard to FIG. 3B. The direction illustrated in FIG. 3A is with respect to the polarity of the RME 302. As illustrated in FIG. 3A, the resistance state of the RME 302 is changed by applying the special supply voltage 301 across the RME 302. The polarity of the special supply voltage 301 determines the resulting state of the RME 302. For example, the special supply voltage 301 is applied with a positive polarity relative to the polarity of the RME 302. As illustrated in FIG. 3A, the RME 302 is set to a low resistance state as indicated by the dashed circle 304.

Figure 3B:
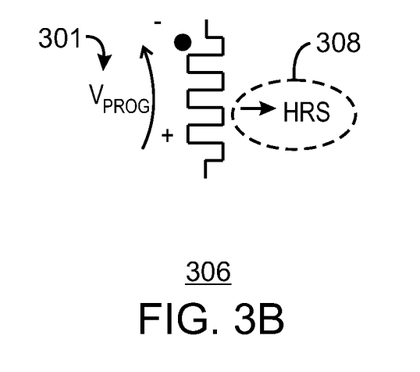
FIG. 3B is a diagram of a RME configured to a high resistance state.

FIG. 3B is a diagram of a RME 306 configured to a high resistance state. As discussed above in reference to FIG. 3A, a RME may be configured to a low or high resistance state depending on the direction of a current resulting from voltage applied at the RME 306. The direction of the current associated with the special supply voltage 301 is illustrated in FIG. 3B. In FIG. 3B, the special supply voltage 301 is applied with a negative polarity relative to the polarity of the RME 306. As illustrated in FIG. 3B, the RME 306 is set to a high resistance state as indicated by the dashed circle 308. As discussed below in reference to FIGS. 4-5, when coupled via a common node, the RMEs may be set an overall high resistance state or a low resistance state.

In some embodiments, the simultaneous set and reset of the RMEs 104, 106 of FIG. 1 may be enabled even when different set and reset voltages are applied across the RMEs 104, 106. For example, the special supply voltage 301 applied across an RME may result in a low resistance state, while a special supply reset voltage (not shown) applied across an RME may result in a high resistance state.

Figure 4:
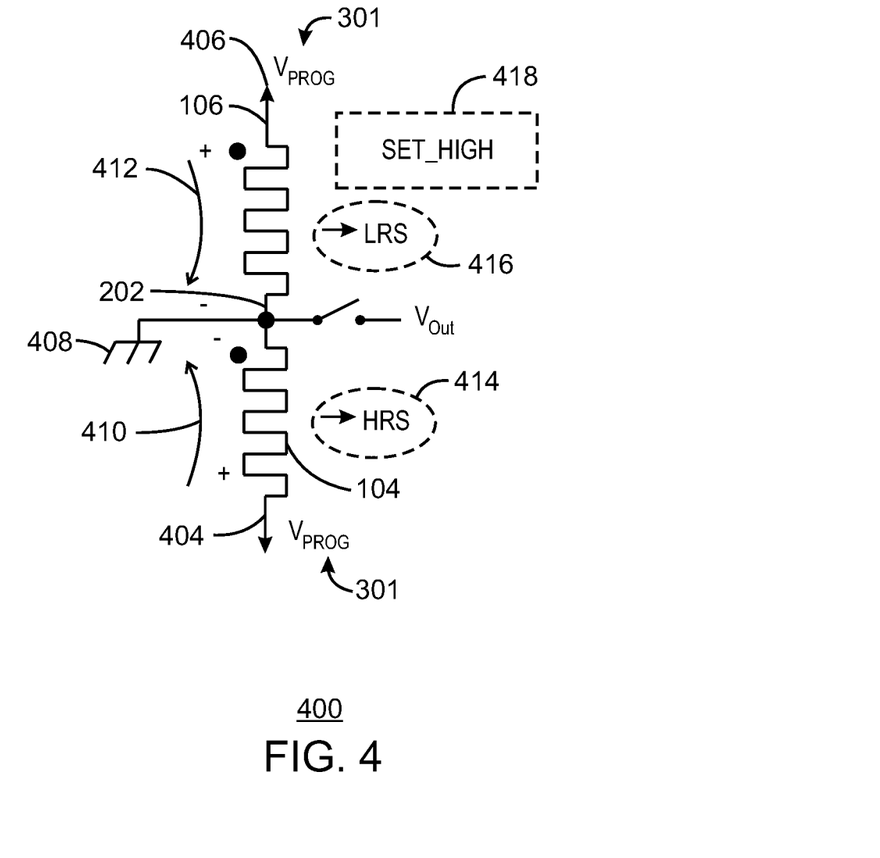
FIG. 4 is a diagram of the coupled RMEs configured to be programmed to a high output state.

FIG. 4 is a diagram of the coupled RMEs 104, 106 configured to be programmed to a high output state. As illustrated in FIG. 4, the first RME 104 and the second RME 106 are coupled via a common node 202. Further, the first RME 104 and the second RME 106 each include a non-common node 404, 406, respectively. In this embodiment the first RME 104 and the second RME 106 are coupled to the special supply voltage 301 via their respective non-common nodes 404, 406, and the common node 202 is coupled to ground as indicated by the arrow 408. The special supply voltage 301 may be applied across the first RME 104 and the resulting current may be in a first direction as indicated by the arrow 410. The first direction 410 may result in the first RME 104 being configured to the high resistance state as indicated by the dashed circle 414. The special supply voltage 301 may be applied at the second RME 106 in a second direction as indicated by the arrow 412. The second direction 412 may result in the second RME 106 being configured to a low resistance state 416. The combined state of the first RME 106 and the second RME 104 is a high resistance state as indicated by the dashed box 418. After the second RME 106 has been set to a low resistance state, and the first RME 104 has been set to a high resistance state, the logic cell 102 of FIG. 1 may be transitioned to the normal state 204 of FIG. 2. As discussed above in reference to FIG. 2, when the second RME 106 is in a low resistance state with the non-common node 212 coupled to VDD, and the first RME 104 is in a high resistance state with the non-common node 210 coupled to ground, the voltage output 208 is the value of VDD, i.e., logic 1.

Figure 5:
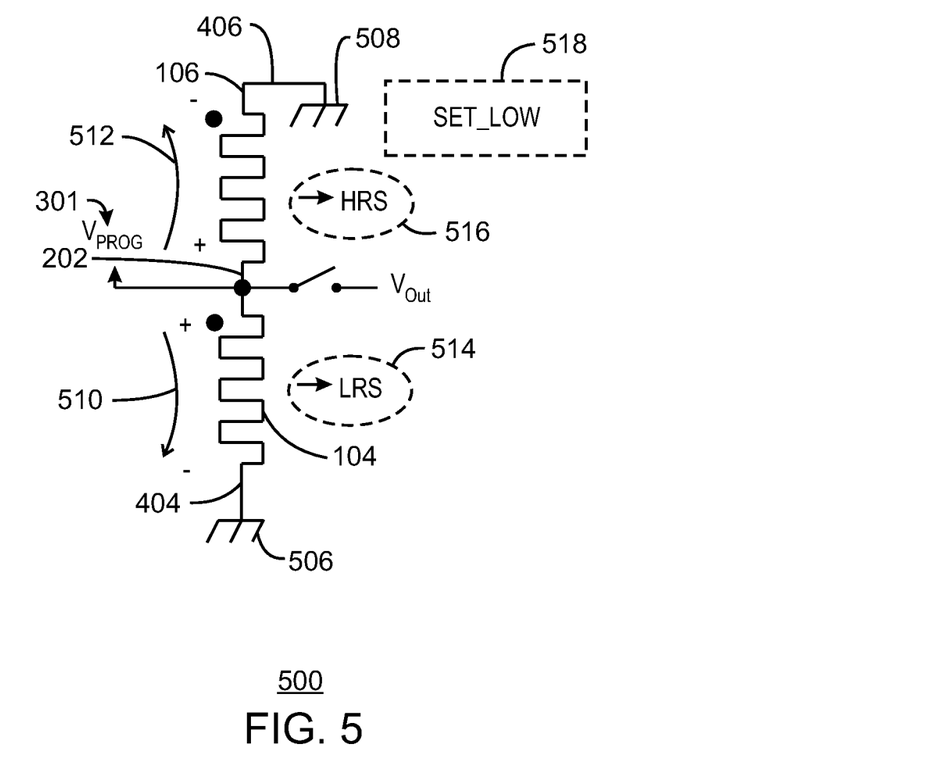
FIG. 5 is a diagram of the RMEs configured to be programmed to a low output state.

FIG. 5 is a diagram of the coupled RMEs 104, 106 configured to be programmed to a low output state. As illustrated in FIG. 5, the first RME 104 and the second RME 106 are coupled via the common node 202. In this embodiment, the common node 202 is coupled to the special supply voltage 301. The non-common nodes 404, 406 are coupled to ground as indicated by the arrows 506 and 508, respectively. The program pulse 116 may be applied across the first RME 104 in a first direction as indicated by the arrow 510. The first direction 510 may result in first RME 104 being configured to the low resistance state as indicated by the dashed circle 514. The program pulse 116 may be applied at the second RME 106 in a second direction as indicated by the arrow 512. The second direction 512 may result in the second RME 106 being configured to a high resistance state as indicated by the dashed circle 516. The combined state of the second RME 106 and the first RME 104 is a low resistance state as indicated by the dashed box 518. After the second RME 106 has been set to a high resistance state 516, and the first RME 104 has been set to a low resistance state 514, the logic cell 102 of FIG. 1, may be transitioned to the normal state 204 of FIG. 2. As discussed above in reference to FIG. 2, when the first RME 104 is in a low resistance state with the non-common node 212 coupled to ground, and the second RME 106 is in a high resistance state with the non-common node 210 coupled to VDD, the resulting voltage output 208 is the value of ground, i.e., logic 0.

The RMEs 104, 106 remain configured to their respective states even when power is removed from the logic circuit. RMEs 104, 106 may be configured to either the high resistance state or the low resistance state by the RME controller 108 discussed above in reference to FIG. 1. The RME controller 108 is discussed in more detail below.

Figure 6:
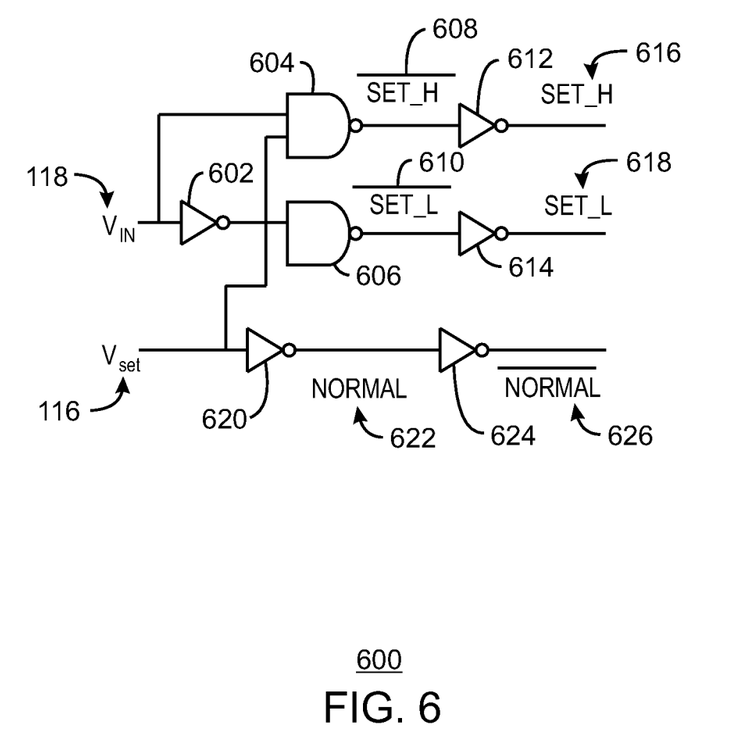
FIG. 6 is a diagram illustrating an embodiment of a first portion of a circuit of the RME controller.

FIG. 6 is a diagram illustrating an embodiment of a first portion 600 of a circuit in the RME controller 108. As illustrated in FIG. 6, the first portion 600 of the RME controller 108 receives the voltage input signal 118 discussed above in reference to FIG. 1. The voltage input signal 118 is received from upstream logic, such as the upstream logic 109 of FIG. 1. The voltage input signal 118 may be received by a first NOT gate 602 and at a first NAND gate 604. The first NOT gate 602 may then provide the voltage input signal to a second NAND gate 606. The first NAND gate 604 may be associated with a high resistance signal and the second NAND gate 606 may be associated with a low resistance signal. Each of the NAND gates 604, 606 may produce signals including SET HIGH bar, indicated by the arrow 608, and SET LOW bar, indicated by the arrow 610. For example, if the voltage input signal 118 indicates a high resistance level, the SET HIGH bar 608 will be low, and the SET LOW bar 610 will be high. The SET HIGH bar signal 608 is provided to a second NOT gate 612. The SET LOW bar signal 610 is provided to a third NOT gate 614. The resulting signals include SET HIGH, as indicated by the arrow 616, and SET LOW, as indicated by the arrow 618. If the voltage input signal 118 indicates a high resistance level, the SET HIGH signal 616 will be high, and the SET LOW signal 618 will be low.

In this embodiment, the first portion 600 of the controller 108 also receives the program pulse 116. The program pulse 116 may be received by the first NAND gate 604, and the second NAND gate 606. The program pulse 116 may also be received at a fourth NOT gate 620. The fourth NOT gate 620 may produce a NORMAL signal, as indicated by the arrow 622. When the program pulse 116 is high, the NORMAL signal 622 will be low. The NORMAL signal 622 is provided to a fifth NOT gate 624. The fifth NOT gate 624 will produce a NORMAL bar signal, as indicated by the arrow 626. When the NORMAL signal 622 is low, the NORMAL bar signal 626 will be high. These six signals including SET HIGH bar 608, SET LOW bar 610, SET HIGH 616, SET LOW 618, NORMAL 622, and NORMAL bar 626, may be provided to additional logic of the RME controller 108, as described below in relation to FIG. 7.

Figure 7:
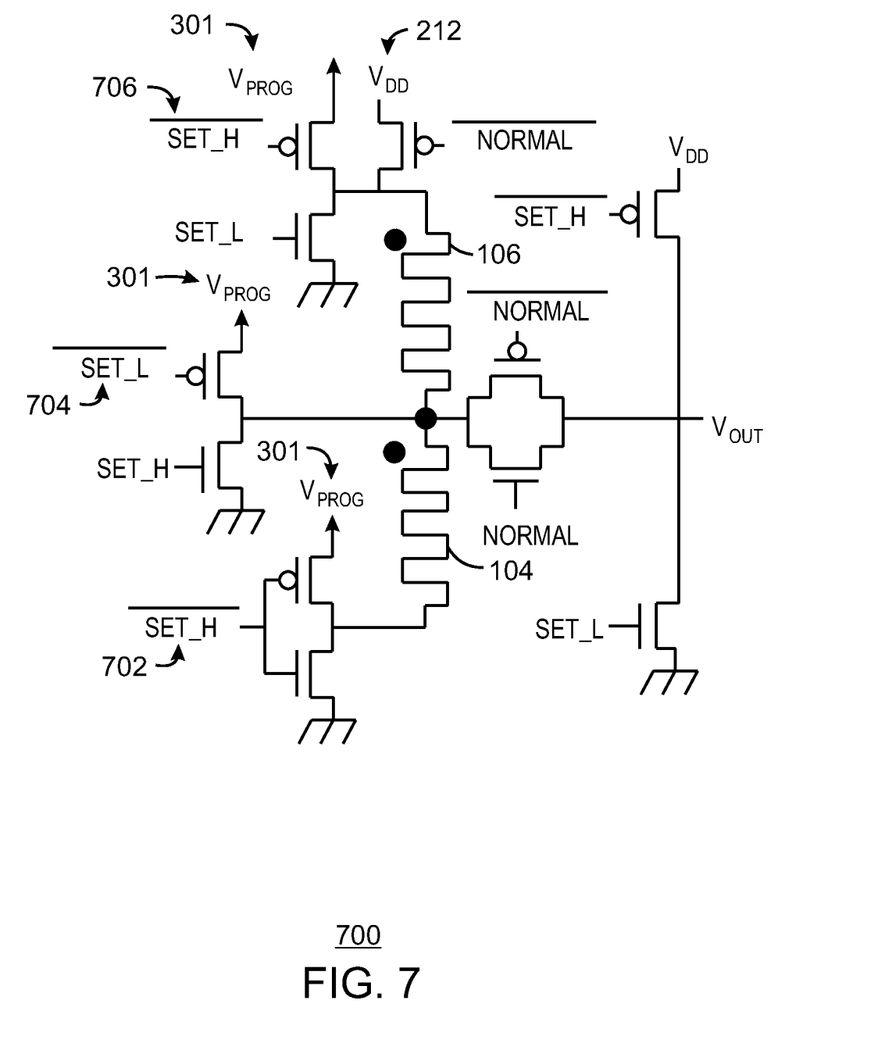
FIG. 7 is a diagram illustrating an embodiment of a second portion of the circuit of the RME controller.

FIG. 7 is a diagram illustrating an embodiment of a second portion 700 of the circuit of the RME controller 108. The second portion 700 may include both "p" type field effect transistors (pFETs) and "n" type field effect transistors (nFETs). Although the RME controller 108 provides one example of circuitry configured to carry out the configurations of FIGS. 2, 4, and 5, other arrangements are possible. FIG. 7 is provided by way of a non-limiting example. Further, although the first and second RMEs 104, 106 are shown in FIG. 7 as a part of the RME controller 108, the RMEs 104, 106 may be either separate from the RME controller 108, or integrated within the RME controller 108. As illustrated in FIG. 7, the second portion 700 of the RME controller 108 may be configured to couple nodes of the RMEs to various signals such as the special supply voltage 301, the voltage input signal 118, the supply voltage 212, and a ground signal. For example, the non-common node of the first RME 104 may be coupled to either the special supply voltage 301 or to a ground signal, as generally indicated by the arrow 702. The common node may be coupled to either ground or to the special supply voltage 301, as generally indicated by the arrow 704. The non-common node of the second RME 106 may be coupled to a ground signal, the special supply voltage 301, or the supply voltage 212, as generally indicated by the arrow 706.

Figure 8:
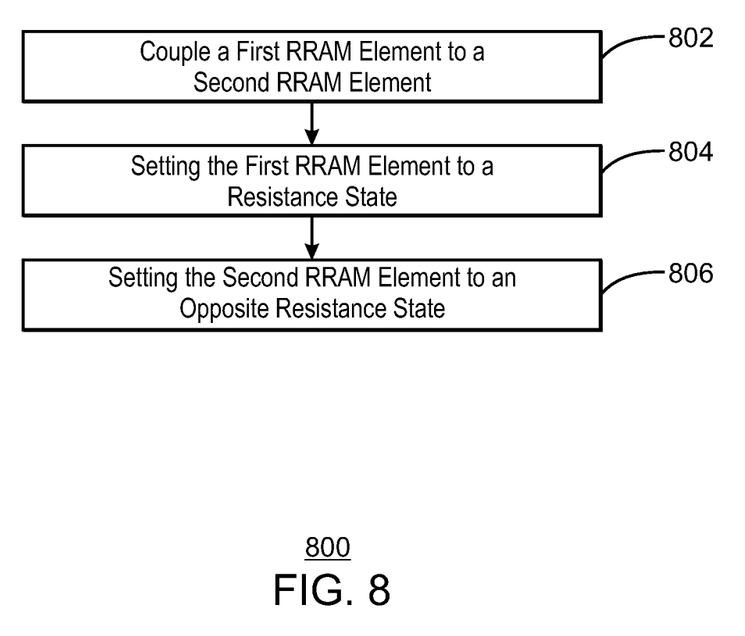
FIG. 8 is a block diagram of a method of configuring RMEs to a resistance state in a storage device.

FIG. 8 is a block diagram of a method 800 of configuring RMEs to a resistance state in a storage device. The method 800 may include, at block 802, coupling, via a common node, a first RME to a second RME. The method 800 may include, at block 804, setting the first RME to either a high voltage resistance state or a low voltage resistance state. The method 800 may include, at block 806, setting the second RME to a different state relative to the state of the first RME, wherein setting the second RME is substantially simultaneous with setting the first RME.

The first and second RMEs may be set substantially simultaneously by logic of a RME controller. The RME controller may set the first and second RMEs by receiving a voltage input signal and a program pulse and coupling the voltage input signal, a special supply voltage, a ground signal, and a supply voltage signal to various nodes of the first and second RME.

In some embodiments, the method 800 may include maintaining the state of each RME until a subsequent program pulse and voltage input signal are received. For example, if the first RME has been set to a high resistance state and the second RME has been set to a low resistance state, these states will remain until the next program pulse is received from upstream logic.

The first RME is set to a low resistance state and the second RME is set to a high resistance state via control logic. Therefore, the method 800 may include coupling the common node between the first RME and the second RME to the ground signal, and coupling the respective non-common nodes to the special supply voltage.

The first RME is set to a high resistance state and the second RME is set to a low resistance state via the control logic. Therefore, the method 800 may include coupling the common node between the first RME and the second RME to the special supply voltage, and coupling the respective non-common nodes to the ground signal.

Example 1

A logic circuit having resistive memory elements is described herein. The logic circuit includes a first resistive memory element (RME) comprising a common node and a non-common node. The logic circuit includes a second RME coupled via the common node to the first RME further comprising a non-common node. The logic circuit includes a control logic to simultaneously set the first RME to either a high voltage resistance state or a low voltage resistance state, and set the second RME to a different state relative to the state of the first RME.

Example 2

An electronic device of logic circuits including logic cells having non-volatile memory elements is described herein. The electronic device, includes a voltage divider comprising a first resistive memory element (RME) element and a second RME coupled via a common node, wherein each of the first and second RMEs each comprise a non-common node. The electronic device includes a control logic to simultaneously set each of the first and second RMEs to different resistance states based on a voltage received.

Example 3

A method of setting output states of logic cells of logic circuits is described herein. The method includes coupling, via a common node, a first resistive memory element (RME) to a second RME. The method includes setting the first RME to either a high voltage resistance state or a low voltage resistance state. The method includes setting the second RME to a different state relative to the state of the first RME, wherein setting the second RME is substantially simultaneous with setting the first RME.

The terms, descriptions and figures used herein are set from by way of illustration only and are not meant as limitations. Those skilled in the art will recognize that many variations are possible within the scope of the invention, which is intended to be defined by the following claims—and there equivalents—in which all terms are meant in their broadest reasonable sense unless otherwise indicated.

What is claimed is:

1. A logic circuit, comprising:
   a first resistive memory element (RME) comprising a common node and a non-common node;
   a second RME coupled via the common node to the first RME further comprising a non-common node; and
   a control logic to simultaneously set the first RME to either a high voltage resistance state or a low voltage resistance state, and set the second RME to a different state relative to the state of the first RME;
   wherein the control logic is to set the first RME to a high resistance state and to set the second RME to a low resistance state to generate a high combined output by:
   coupling the common node to a ground signal; and
   coupling non-common nodes of each of the first RME and the second RME to a special supply voltage.

2. The logic circuit, of claim 1, wherein the control logic is to
   receive a program pulse associated with a time element and
   receive a voltage input signal as output from upstream logic.

3. The logic circuit of claim 2, wherein the state of each RME remains until a subsequent program pulse and voltage input signal are received.

4. The logic circuit of claim 1, wherein, via control logic, the first RME is set to a low resistance state and the second RME is set to a high resistance state to generate a low combined output by:
   coupling the common node to the special supply voltage; and
   coupling non-common nodes of each of the first RME and the second RME to the ground signal.

5. An electronic device, comprising:
   a voltage divider comprising a first resistive memory element (RME) element and a second RME coupled via a common node, wherein each of the first and second RMEs each comprise a non-common node and a first polarity of the first RME is opposite a second polarity of the second RME with respect to the common node; and
   a control logic to simultaneously set each of the first and second RMEs to different resistance states based on a voltage received.

6. The electronic device of claim 5, wherein the control logic is to:
   receive a program pulse associated with a time element; and
   receive a voltage input signal as output from upstream logic.

7. The electronic device of claim 6, wherein the state of each RME remains until a subsequent program pulse and voltage input signal are received.

8. The electronic device of claim 5, wherein, via control logic, the first RME is set to a high resistance state and the second RME is set to a low resistance state to generate a high combined output by:
   coupling the common node to a ground signal; and
   coupling non-common nodes of each of the first RME and the second RME to a special supply voltage.

9. The electronic device of claim 5, wherein, via control logic, the first RME is set to a low resistance state and the second RME is set to a high resistance state to generate a low combined output by:
   coupling the common node to a special supply voltage; and
   coupling non-common nodes of each of the first RME and the second RME to a ground signal.

10. A method, comprising:
    coupling, via a common node, a first resistive memory element (RME) to a second RME;
    setting the first RME to either a high voltage resistance state or a low voltage resistance state; and
    setting the second RME to a different state relative to the state of the first RME by coupling the common node to a ground signal and coupling non-common nodes of each of the first RME and the second RME to a special supply voltage, wherein setting the second RME is substantially simultaneous with setting the first RME.

11. The method, of claim 10, wherein setting the first RME and the second RME, comprises:
    receiving a program pulse associated with a time element of the system;
    receiving a voltage input signal as output from upstream logic; and
    setting the first and second RMEs to their respective voltage resistance states based on the voltage input signal.

12. The method of claim 11, comprising maintaining the state of each RME until a subsequent program pulse and voltage input signal are received.

13. The method of claim 10, wherein, via control logic, the first RME is set to a high resistance state and the second RME is set to a low resistance state to generate a high combined output by:
    coupling the common node to a ground signal; and
    coupling non-common nodes of each of the first RME and the second RME to the special supply voltage.

14. The method of claim 10, wherein, via control logic, the first RME is set to a low resistance state and the second RME is set to a high resistance state to generate a low combined output by:
    coupling the common node to the special supply voltage; and
    coupling non-common nodes of each of the first RME and the second RME to a ground signal.

15. The logic circuit of claim 1, further comprising:
    a transistor to couple the first RME to a supply voltage in a normal state; and
    a switch to couple the common node to an output voltage terminal in the normal state.

16. The logic circuit of claim 1, further comprising a transistor to couple an output voltage terminal to a supply voltage while the control logic couples the common node to the ground signal.

17. The logic circuit of claim 16, further comprising:
a switch to disconnect the output voltage terminal from the common node while the control logic couples the common node to the ground signal.

18. The logic circuit of claim 4, further comprising:
a first transistor to couple an output voltage terminal to a supply voltage while the control logic couples the common node to the ground signal; and
a second transistor to couple the output voltage terminal to the ground signal while the control logic couples the common node to the special supply voltage.

19. The logic circuit of claim 1, wherein the control logic is to simultaneously change the first RME to the low resistance state from the high resistance state and set the second RME to the high resistance state from the low resistance state.

\* \* \* \* \*